(12) United States Patent
Yoo et al.

(10) Patent No.: US 8,184,048 B2
(45) Date of Patent: May 22, 2012

(54) DUAL MODE SATELLITE SIGNAL RECEIVER AND METHOD THEREOF

(75) Inventors: Chang-Sik Yoo, Bucheon-Si (KR); Jun-Gi Jo, Seoul (KR); Seong-Eon Park, Seoul (KR)

(73) Assignee: Core Logic, Inc., Seoul (KR)

( * ) Notice: Subject to any disclaimer, the term of this patent is extended or adjusted under 35 U.S.C. 154(b) by 531 days.

(21) Appl. No.: 12/393,107

(22) Filed: Feb. 26, 2009

(65) Prior Publication Data

US 2009/0219204 A1 Sep. 3, 2009

Related U.S. Application Data

(60) Provisional application No. 61/067,642, filed on Feb. 29, 2008.

(51) Int. Cl.
*G01S 19/33* (2010.01)
*G01S 19/40* (2010.01)
(52) U.S. Cl. .................. 342/357.73; 342/357.23
(58) Field of Classification Search ............ 342/357.01, 342/357.73, 357.23
See application file for complete search history.

(56) References Cited

U.S. PATENT DOCUMENTS

| | | | | |
|---|---|---|---|---|
| 5,694,414 A * | 12/1997 | Smith et al. | ...... | 375/130 |
| 5,790,587 A * | 8/1998 | Smith et al. | ...... | 375/147 |
| 5,923,287 A * | 7/1999 | Lennen | ...... | 342/357.73 |
| 5,952,880 A * | 9/1999 | Voorman et al. | ...... | 330/254 |
| 6,466,803 B1 * | 10/2002 | Gardner | ...... | 455/553.1 |
| 6,600,909 B1 * | 7/2003 | Nikulin et al. | ...... | 455/260 |
| 7,072,427 B2 * | 7/2006 | Rawlins et al. | ...... | 375/346 |
| 7,095,368 B1 * | 8/2006 | van Diggelen | ...... | 342/357.62 |
| 7,358,896 B2 * | 4/2008 | Gradincic et al. | ...... | 342/357.72 |
| 7,683,831 B2 * | 3/2010 | Fischer | ...... | 342/357.64 |
| 2002/0054627 A1 * | 5/2002 | Asikainen | ...... | 375/219 |
| 2006/0176215 A1 * | 8/2006 | Dubash et al. | ...... | 342/357.06 |
| 2007/0159259 A1 * | 7/2007 | Suh et al. | ...... | 331/2 |
| 2010/0302100 A1 * | 12/2010 | Yang et al. | ...... | 342/357.73 |

* cited by examiner

*Primary Examiner* — Thomas Tarcza
*Assistant Examiner* — Frank J McGue
(74) *Attorney, Agent, or Firm* — Edwards Wildman Palmer LLP

(57) ABSTRACT

A dual mode satellite signal receiver capable of supporting at least two global navigation satellite systems and a satellite signal receiving method are provided. The dual mode satellite signal receiver comprises a frequency synthesizer for generating a local oscillator signal based on a reference frequency; a mixer for mixing the local oscillator signal with a satellite signal and outputting the mixed signal as a signal of an intermediate frequency band; a first filter for filtering the signal output from the mixer to reject an image signal and output only an actual signal; a second filter for filtering the actual signal to output only a predetermined bandwidth according to a positioning mode; and an amplifier for amplifying the second filter output signal to a predetermined level and outputting the amplified signal.

16 Claims, 4 Drawing Sheets

DUAL MODE SATELLITE SIGNAL RECEIVER AND METHOD THEREOF

CROSS REFERENCE TO RELATED APPLICATION

This application claims the benefit of the U.S. Provisional Application No. 61/067,642, filed on Feb. 29, 2008, the entire contents of which are incorporated herein by reference.

FIELD OF THE INVENTION

The invention relates to a satellite signal receiver and a satellite signal receiving method. In particular, the invention relates to a satellite signal receiver and a receiving method that support a plurality of global navigation satellite systems.

BACKGROUND OF THE INVENTION

The Global Navigation Satellite System (GNSS) accurately tracks the position of a target object on the ground using a network of artificial satellites in space. The GNSS includes the Global Positioning System (GPS) operated by the United States Department of Defense and the European Union's Galileo positioning system (Galileo) in the initial development phase. The GNSS is used in many applications, such as, for example, in positioning of aircraft or shipping vessels and in information/communications technology such as telematics.

GPS is a global navigation satellite system that provides location information using signals from satellites orbiting the earth. GPS was primarily established for military purposes, but since 2000, selective availability (SA, an intentional noise) was removed from the signals making GPS widely available in various fields. Meanwhile, the Galileo positioning system is a global navigation satellite system intended primarily for civilian use. Galileo provides more precise measurement and enhanced signaling than GPS, and it is expected that the Galileo positioning system will be used in various fields in the future. However, the GPS and Galileo positioning systems are complementary to each other, and it is expected that the two systems will co-exist. Therefore, a satellite signal receiver operable in both GPS and Galileo positioning systems is desirable.

SUMMARY OF THE INVENTION

An object of the invention is to provide a dual mode satellite signal receiver that is applicable to both GPS and Galileo Positioning Systems, and to provide a satellite signal receiving method for the dual mode satellite signal receiver.

According to one aspect of the invention, a dual mode satellite signal receiver comprises: (1) a frequency synthesizer for generating a local oscillator signal based on a reference frequency; (2) a mixer for mixing the local oscillator signal with a satellite signal, and outputting the mixed signal as a signal of an intermediate frequency band; (3) a first filter for filtering the signal output from the mixer to reject an image/noise signal and output only an actual signal; (4) a second filter for filtering the actual signal output from the first filter to output only a predetermined bandwidth according to a positioning mode; and (5) an amplifier for amplifying the signal output from the second filter to a predetermined level and then outputting the amplified signal.

According to another aspect of the invention, a dual mode satellite signal receiving method for a dual mode satellite signal receiver supporting at least two global navigation satellite systems comprises: (a) generating a local oscillator signal based on a reference frequency; (b) mixing the local oscillator signal with a satellite signal and outputting the mixed signal as a signal of an intermediate frequency band; (c) filtering the mixed signal to reject an image/noise signal and output only an actual signal; (d) filtering the actual signal to output only a predetermined bandwidth according to a positioning mode; and (e) amplifying the signal with the predetermined bandwidth to a predetermined level and then outputting the amplified signal.

DETAILED DESCRIPTION OF THE INVENTION

Figure 1:
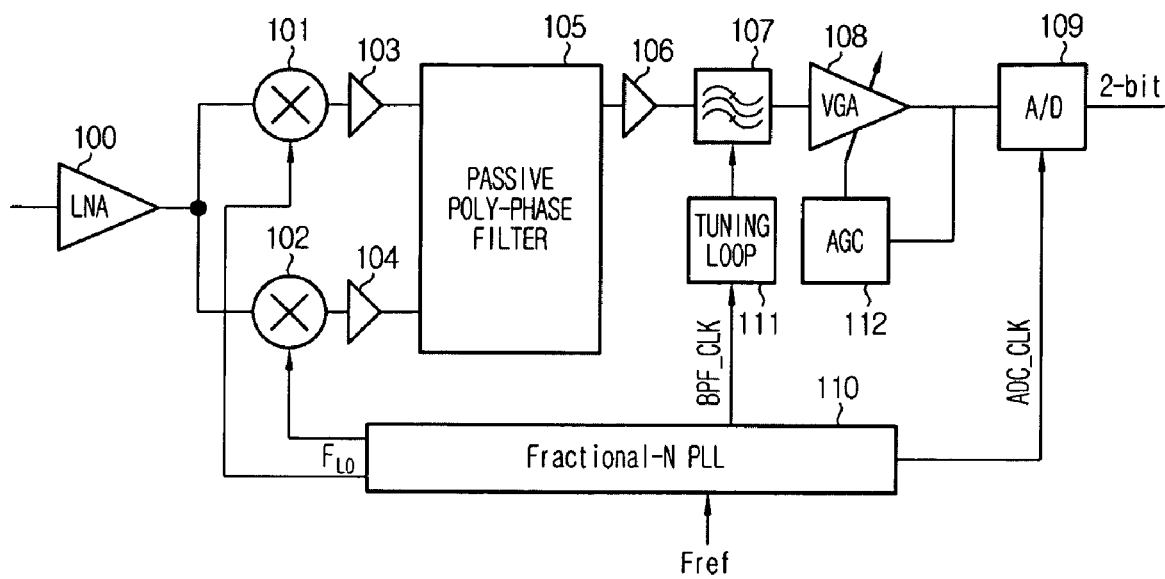
FIG. 1 is a block circuit diagram of a dual mode satellite signal receiver according to an embodiment of the invention.

FIG. 1 shows a dual mode satellite signal receiver according to the invention. The receiver comprises a low noise amplifier 100, mixers 101 and 102, buffers 103 and 104, a passive poly-phase filter 105, a buffer 106, a band-pass filter 107, a variable gain amplifier 108, an analog-to-digital converter 109 and a fractional-N phase locked loop 110.

The low noise amplifier 100 amplifies the received satellite signal and outputs the amplified signal. The low noise amplifier 100 outputs a satellite signal of single phase as a differential signal. That is, the low noise amplifier 100 outputs a satellite signal of single phase as an 'I' (In-phase) signal and a 'Q' (Quadrature-phase) signal. Preferably, the satellite signal has a frequency of 1.575 GHz. The low noise amplifier 100 is designed to have a small noise factor and a gain of approximately 26 dB.

The mixers 101 and 102 mix the satellite signal output from the low noise amplifier 100 with a signal output from the fractional-N phase locked loop 110, and down-convert the mixed signal to an intermediate frequency band. The mixer 101, which is an 'I' (In-phase) mixer, converts the 'I' signal output from the low noise amplifier 100 to an intermediate frequency band, and the mixer 102, which is a 'Q' (Quadrature-phase) mixer, converts the 'Q' signal output from the low noise amplifier 100 to an intermediate frequency band. The mixer 101 and the mixer 102 have a phase difference of 90 degrees. Preferably, the mixers 101 and 102 down-convert a satellite signal of 1.575 GHz to a frequency of 4 MHz.

When a satellite signal of 1.575 GHz is down-converted to a frequency of 4 MHz, the down conversion also creates a component of the 1.575 GHz signal at a frequency of −4 MHz. The signal component at the frequency of −4 MHz cannot be distinguished from a signal component at the frequency of 4 MHz. Therefore, the mixers 101 and 102 have a 90-degree phase difference to remove the signal component at the frequency of −4 MHz. The intermediate frequency signals output from the mixers 101 and 102 are respectively fed through the buffers 103 and 104.

The passive poly-phase filter 105 receives the 90-degree phase difference signals from the buffers 103 and 104, rejects an image signal at the frequency −4 MHz, and outputs the actual signal at the frequency 4 MHz to the buffer 106. In other words, between the signals at the frequencies of 4 MHz and −4 MHz, the passive poly-phase filter 105 rejects the noise/image signal, i.e. the signal at the frequency of −4 MHz, and passes the signal at the frequency of 4 MHz.

The band-pass filter 107 filters and outputs a predetermined bandwidth of the signal from the buffer 106 based on a center frequency of 4 MHz, and rejects the other bandwidth. That is, in a GPS mode, the band-pass filter 107 passes a bandwidth of 2 MHz or 4 MHz based on a center frequency of 4 MHz, and in a Galileo mode, the band-pass filter 107 passes a bandwidth of 6 MHz based on a center frequency of 4 MHz. The center frequency of the band-pass filter 107 is automatically tuned to 4 MHz by a tuning loop 111.

The variable gain amplifier 108 amplifies the signal received from the band-pass filter 107 to a predetermined level, and outputs the amplified signal to the analog-to-digital converter 109. To properly operate the analog-to-digital converter 109, a signal level should be constant. An automatic gain control loop (AGC loop) 112 senses an output level of the variable gain amplifier 108. If the output level is high, the automatic gain control loop 112 reduces a gain control voltage, so that a gain of the variable gain amplifier 108 is reduced. If the output level is low, the automatic gain control loop 112 increases a gain control voltage, so that a gain of the variable gain amplifier 108 is increased. The variable gain amplifier 108 controls a gain linearly in dB, and is discussed in more detail below.

The analog-to-digital converter 109 converts an analog signal received from the variable gain amplifier 108 into a digital signal. Preferably, the analog-to-digital converter 109 converts an analog signal received from the variable gain amplifier 108 into a 2-bit digital signal according to a clock provided by the fractional-N phase locked loop 110.

The fractional-N phase locked loop 110 is a frequency synthesizer, and generates an accurate local oscillator ($F_{LO}$) signal using a reference frequency (Fref) and outputs the local oscillator signal to the mixers 101 and 102. Because there is only one channel in GPS and Galileo Positioning Systems, it is possible to use an integer-N phase locked loop frequency synthesizer. However, the satellite signal receiver according to the invention may share a temperature compensated crystal oscillator (TCXO) with the other RF (radio frequency) transceiver coexisting on the same system. Therefore, the satellite signal receiver according to the invention uses a fractional-N phase locked loop that is capable of supporting multiple reference frequencies generated from the temperature compensated crystal oscillator.

As mentioned above, the fractional-N phase locked loop 110 generates and outputs a local oscillator signal. In addition, the fractional-N phase locked loop 110 provides a clock signal to the tuning loop that automatically tunes the center frequency of the band-pass filter 107, and provides a clock signal for signal sampling of the analog-to-digital converter 109.

Figure 2:
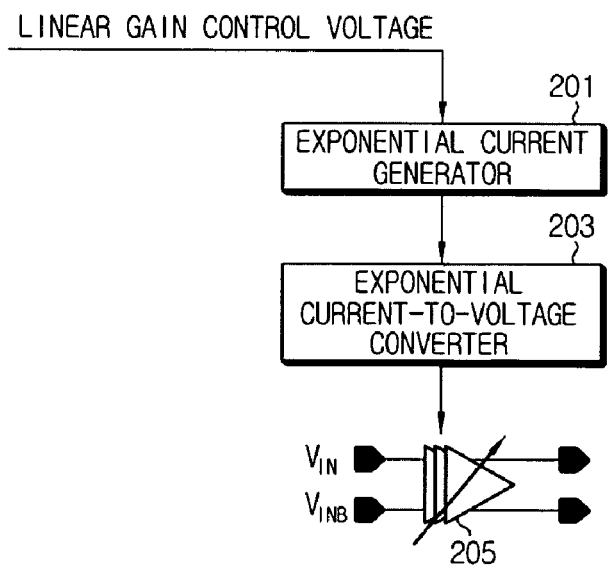
FIG. 2 illustrates a configuration of the variable gain amplifier of FIG. 1.

FIG. 2 shows variable gain amplifier 108, which includes an exponential current generator 201, an exponential current-to-voltage converter 203 and an amplifier 205. The exponential current generator 201 generates two exponential currents according to a linear gain control voltage received from an automatic gain control loop. The exponential currents indicates that the ratio of two generated currents has a characteristic of an exponential function. An equation of the ratio may represent either NMOS, PMOS or both. When an equation of the ratio includes both NMOS and PMOS, the property of exponential currents is influenced by a physical difference between NMOS and PMOS. However, where an equation of the ratio represents either NMOS or PMOS, the above-mentioned influence can be removed. The exponential currents generated in the exponential current generator 201 exhibit a linear characteristic when converting into unit of dB.

The exponential current-to-voltage converter 203 converts the exponential currents generated in the exponential current generator 201 into voltage and outputs that voltage. The exponential current-to-voltage converter 203 converts the two currents into voltage. The voltage output from the exponential current-to-voltage converter 203 is referred to as a differential voltage.

The amplifier 205 amplifies an input signal by controlling a gain according to the differential voltage received from the exponential current-to-voltage converter 203, and outputs the amplified signal. The gain control in the amplifier 205 has a linear-in-dB characteristic. That is, in dB scale, the gain varies linearly to the differential voltage.

Figure 3:
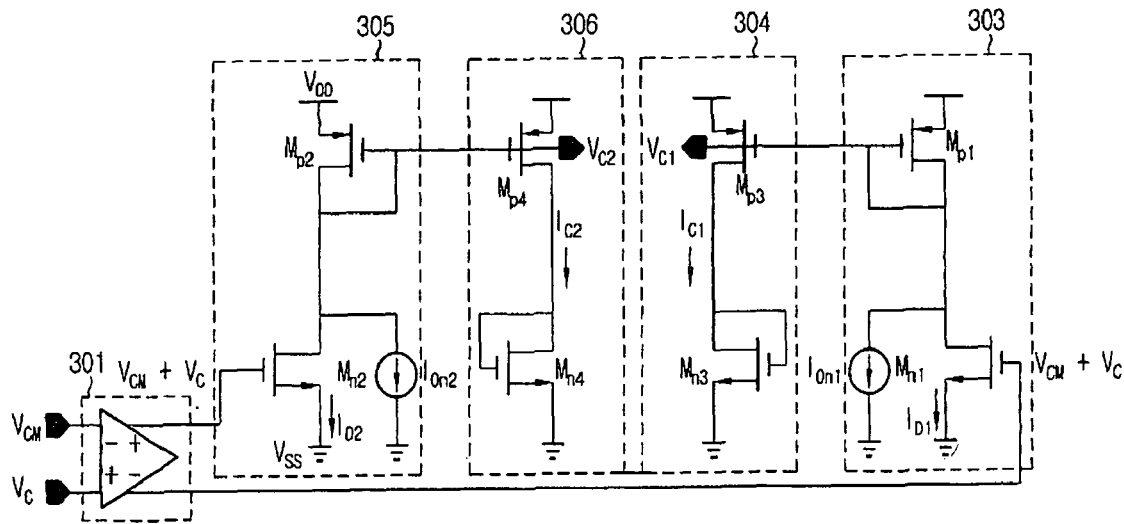
FIG. 3 is a circuit diagram illustrating an embodiment of the exponential current generator of FIG. 2 according to the invention.

FIG. 3 shows an embodiment of the exponential current generator of FIG. 2 according to the invention. The exponential current generator 201 includes a single-to-differential converter 301, a first current generator 303, a first current mirror 304, a second current generator 305 and a second current mirror 306. The single-to-differential converter 301 amplifies a single-ended input signal and outputs the amplified signal as two differential signals. FIG. 3 shows only a differential amplifier. As a differential signal, the single-to-differential converter 301 outputs the sum of a common-mode voltage (Vcm) and a control voltage (Vc), and a difference between a common-mode voltage (Vcm) and a control voltage (Vc).

The first current generator 303 includes a PMOS transistor ($M_{p1}$) and an NMOS transistor ($M_{n1}$). A source terminal of the PMOS transistor ($M_{p1}$) is connected to a direct voltage (VDD), a drain terminal of the PMOS transistor ($M_{p1}$) is connected to a drain terminal of the NMOS transistor ($M_{n1}$), and a gate terminal of the PMOS transistor ($M_{p1}$) is connected to a gate terminal of the first current mirror 304.

The difference (Vcm−Vc) between a common-mode voltage (Vcm) and a control voltage (Vc) output from the single-to-differential converter 301 is inputted into a gate terminal of the NMOS transistor ($M_{n1}$) of the first current generator 303. The drain terminal of the NMOS transistor ($M_{n1}$) is connected to a current source ($I_{On1}$), and a source terminal of the NMOS transistor ($M_{n1}$) is ground. In the first current generator 303, a current ($I_{D1}$) generated by the NMOS transistor ($M_{n1}$) and the current source ($I_{On1}$) are mirrored and output to the first current mirror 304 through the gate terminal of the PMOS transistor ($M_{p1}$). Thus, a current output to the first current mirror 304 is the sum of the current ($I_{D1}$) generated by the NMOS transistor ($M_{n1}$) and the current source ($I_{On1}$).

The first current mirror 304 includes an NMOS transistor ($M_{n3}$) and a PMOS transistor ($M_{p3}$). As mentioned above, the first current mirror 304 outputs the sum of the current ($I_{D1}$) generated by the NMOS transistor ($M_{n1}$) and the current source ($I_{On1}$) as a first current ($I_{C1}$).

Meanwhile, the second current generator 305 has the same circuit configuration as the first current generator 303. A source terminal of a PMOS transistor ($M_{p2}$) of the second current generator 305 is connected to a direct voltage (VDD), a drain terminal of the PMOS transistor ($M_{p2}$) is connected to a drain terminal of an NMOS transistor ($M_{n2}$), and a gate terminal of the PMOS transistor ($M_{p2}$) is connected to a gate terminal of the second current mirror 306. However, the sum (Vcm+Vc) of a common-mode voltage (Vcm) and a control voltage (Vc) generated from the single-to-differential converter 301 is input to a gate terminal of the NMOS transistor ($M_{n2}$) of the second current generator 305.

In the second current generator 305, a current ($I_{D2}$) generated by the NMOS transistor ($M_{n2}$) and a current source ($I_{On2}$) are mirrored and output to the second current mirror 306 through the gate terminal of the PMOS transistor ($M_{p2}$). Therefore, a current output to the second current mirror 306 is the sum of the current ($I_{D2}$) generated by the NMOS transistor ($M_{n2}$) and the current source ($I_{On2}$).

The second current mirror 306 includes an NMOS transistor ($M_{n4}$) and a PMOS transistor ($M_{p4}$). As mentioned above, the second current mirror 306 outputs the sum of the current ($I_{D2}$) generated by the NMOS transistor ($M_{n2}$) of the second current generator 305 and the current source ($I_{On2}$) as a second current ($I_{C2}$).

The first current ($I_{C1}$) of the first current mirror 304 and the second current ($I_{C2}$) of the second current mirror 306 are input to the exponential current-to-voltage converter 203 of FIG. 2, which converts the currents into a differential voltage to be used in the amplifier 205.

The gain of the amplifier 205 is a ratio of input signal voltage to output signal voltage. A ratio of the first current ($I_{C1}$) to the second current ($I_{C2}$) of the exponential current generator 201 can be represented as an exponential function, so that the voltage ratio exhibits a linear characteristic in dB. The exponential function can be typically approximated with the Taylor Series. An approximation equation is represented by Equation 1.

$$e^{ax} \approx 1 + \frac{a}{1!}x + \frac{a^2}{2!}x^2 = \frac{1}{2}[1 + (1+ax)^2] \quad \text{[Equation 1]}$$

$$e^{2ax} = \frac{e^{ax}}{e^{-ax}} \approx \frac{[1+(1+ax)^2]}{[1+(1-ax)^2]}$$

$$f_{apprx}(x) = \frac{[k+(1+ax)^2]}{[k+(1-ax)^2]}$$

A ratio of the first current ($I_{C1}$) to the second current ($I_{C2}$) generated in the circuit of FIG. 3, is represented by Equation 2.

$$f_2(V_C) = \quad \text{[Equation 2]}$$

$$\frac{I_{C2}}{I_{C1}} = \frac{I_{On} + I_{D2}}{I_{On} + I_{D1}} = \frac{I_{On} + K_n(V_C + V_{CM} - V_{SS} - V_{THn})^2}{I_{On} + K_n(-V_C + V_{CM} - V_{SS} - V_{THn})^2} =$$

$$\frac{I_{On} + K_n(V_{CM} - V_{SS} - V_{THn})^2 \left(1 + \frac{V_C}{(V_{CM} - V_{SS} - V_{THn})}\right)^2}{I_{On} + K_n(V_{CM} - V_{SS} - V_{THn})^2 \left(1 - \frac{V_C}{(V_{CM} - V_{SS} - V_{THn})}\right)^2} =$$

$$\frac{K_n(V_{CM} - V_{SS} - V_{THn})^2 \left\{\frac{I_{On}}{K_n(V_{CM} - V_{SS} - V_{THn})^2} + \left(1 + \frac{V_C}{(V_{CM} - V_{SS} - V_{THn})}\right)^2\right\}}{K_n(V_{CM} - V_{SS} - V_{THn})^2 \left\{\frac{I_{On}}{K_n(V_{CM} - V_{SS} - V_{THn})^2} + \left(1 - \frac{V_C}{(V_{CM} - V_{SS} - V_{THn})}\right)^2\right\}} =$$

$$\frac{K_n(V_{CM} - V_{THn})^2 \left\{\frac{I_{On}}{K_n(V_{CM} - V_{THn})^2} + \left(1 + \frac{V_C}{(V_{CM} - V_{THn})}\right)^2\right\}}{K_n(V_{CM} - V_{THn})^2 \left\{\frac{I_{On}}{K_n(V_{CM} - V_{THn})^2} + \left(1 - \frac{V_C}{(V_{CM} - V_{THn})}\right)^2\right\}}$$

Here, $K_{n1}$ and $K_{n2}$ are current constants of the NMOS transistor ($M_{n1}$) and the NMOS transistor ($M_{n2}$), respectively. $V_{THn1}$ and $V_{THn2}$ are threshold voltages of the NMOS transistor ($M_{n1}$) and the NMOS transistor ($M_{n2}$), respectively.

As shown in Equation 2, the ratio of the first current ($I_{C1}$) to the second current ($I_{C2}$) of FIG. 3 is in the same form as the approximation equation of Equation 1. The ratio exhibits a characteristic of an exponential function. Therefore, the gain of amplifier 205 exhibits a linear characteristic in dB. Furthermore, the ratio of two currents is represented in the equation in terms of only NMOS constants $K_{n1}$, $K_{n2}$, $V_{THn1}$ and $V_{THn2}$. Thus, the ratio maintains a characteristic of an exponential function even if a mismatch between NMOS and PMOS occurs due to change in temperature, process or supply voltage.

Figure 4:
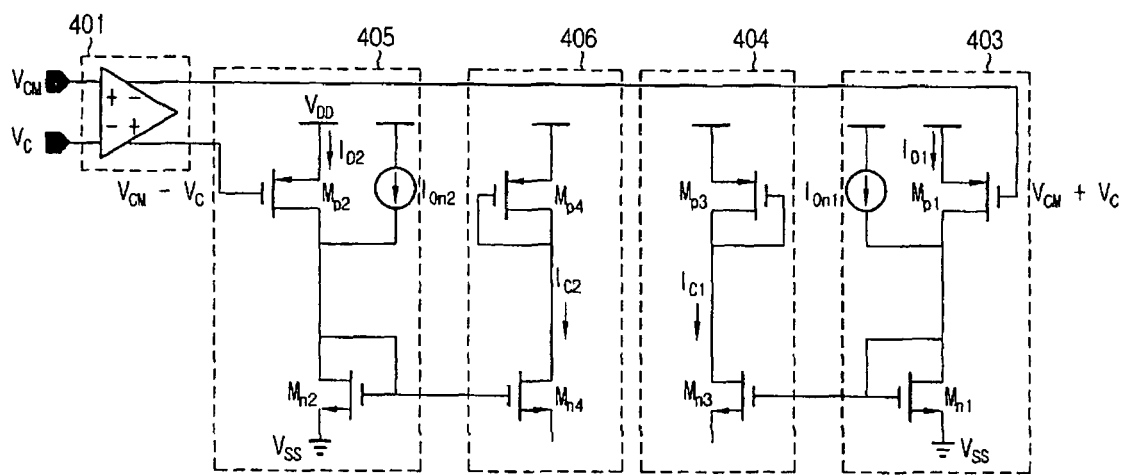
FIG. 4 is a circuit diagram illustrating another embodiment of the exponential current generator of FIG. 2 according to the invention.

FIG. 4 shows another embodiment of the exponential current generator of FIG. 2 according to the invention. This exponential current generator includes a single-to-differential converter 401, a first current generator 403, a first current mirror 404, a second current generator 405 and a second current mirror 406.

The single-to-differential converter 401 amplifies a single-ended input signal, converts the amplified signal into two differential signals, and outputs the differential signals. FIG. 4 shows only a differential amplifier. As a differential signal, the single-to-differential converter 401 outputs the sum of a common-mode voltage (Vcm) and a control voltage (Vc), and a difference between a common-mode voltage (Vcm) and a control voltage (Vc).

The first current generator 403 includes a PMOS transistor ($M_{p1}$) and an NMOS transistor ($M_{n1}$). Unlike the embodiment of FIG. 3, a source terminal of the PMOS transistor ($M_{n1}$) is connected to a direct voltage (VDD), a drain terminal of the PMOS transistor ($M_{p1}$) is connected to a drain terminal of the NMOS transistor ($M_{n1}$), and the sum (Vcm+Vc) is connected to a gate terminal of the PMOS transistor ($M_{p1}$).

Meanwhile, a gate terminal of the NMOS transistor ($M_{n1}$) of the first current generator 403 is connected to a gate terminal of an NMOS transistor ($M_{n3}$) of the first mirror 404. In the first current generator 403, a current ($I_{D1}$) generated by the PMOS transistor ($M_{p1}$) and a current source ($I_{On1}$) are mirrored and output to the first current mirror 404 through the gate terminal of the NMOS transistor ($M_{n1}$). Therefore, a current received by the first current mirror 404 is the sum of the current ($I_{D1}$) generated by the PMOS transistor ($M_{p1}$) and the current source ($I_{On1}$).

The first current mirror 404 includes an NMOS transistor ($M_{n3}$) and a PMOS transistor ($M_{p3}$). As mentioned above, the first current mirror 404 outputs the sum of the current ($I_{D1}$) and the current source ($I_{On1}$) as a first current ($I_{C1}$).

Meanwhile, the second current generator 405 has the same circuit configuration as the first current generator 403. A source terminal of a PMOS transistor ($M_{p2}$) of the second current generator 405 is connected to a direct voltage (VDD), and a drain terminal of the PMOS transistor ($M_{p2}$) is connected to a drain terminal of an NMOS transistor ($M_{n2}$). However, the difference (Vcm-Vc) of a common-mode voltage (Vcm) and a control voltage (Vc) received from the single-to-differential converter 401 is input to a gate terminal of the PMOS transistor ($M_{p2}$) of the second current generator 405.

In the second current generator 405, a current ($I_{D2}$) generated by the PMOS transistor ($M_{p2}$) and a current source ($I_{On2}$) are mirrored and output to the second current mirror 406 through a gate terminal of the NMOS transistor ($M_{n2}$). Therefore, a current output to the second current mirror 406 is the sum of the current ($I_{D2}$) generated by the PMOS transistor ($M_{p2}$) and the current source ($I_{On2}$).

The second current mirror 406 includes an NMOS transistor ($M_{n4}$) and a PMOS transistor ($M_{p4}$). As mentioned above, the second current mirror 406 outputs the sum of the current ($I_{D2}$) and the current source (Ion) as a second current ($I_{C2}$).

The first current ($I_{C1}$) of the first current mirror 404 and the second current ($I_{C2}$) of the second current mirror 406 are input to the exponential current-to-voltage converter 203 of FIG. 2, which converts the currents into a differential voltage to be used in the amplifier 205.

A ratio of the first current ($I_{C1}$) to the second current ($I_{C2}$) generated in the circuit of FIG. 4, is represented by Equation 3.

$$f_2(V_C) = \frac{I_{C2}}{I_{C1}} = \quad \text{[Equation 3]}$$

$$\frac{I_{0p} + I_{D2}}{I_{0p} + I_{D1}} = \frac{I_{0p} + K_{p2}(-V_C + V_{CM} - V_{DD} + |V_{THp2}|)^2}{I_{0p} + K_{p1}(V_C + V_{CM} - V_{DD} + |V_{THp1}|)^2} =$$

$$\frac{I_{0p} + K_{p2}(V_{DD} - V_{CM} - |V_{THp2}|)^2 \times \left(1 + \frac{V_C}{(V_{DD} - V_{CM} - |V_{THp2}|)}\right)^2}{I_{0p} + K_{p1}(V_{DD} - V_{CM} - |V_{THp1}|)^2 \times \left(1 - \frac{V_C}{(V_{DD} - V_{CM} - |V_{THp1}|)}\right)^2} =$$

$$\frac{K_{p2}(V_{DD} - V_{CM} - |V_{THp2}|)^2 \times \left\{\frac{I_{On}}{K_{p2}(V_{DD} - V_{CM} - |V_{THp2}|)^2} + \left(1 + \frac{V_C}{(V_{DD} - V_{CM} - |V_{THp2}|)}\right)^2\right\}}{K_{p1}(V_{DD} - V_{CM} - |V_{THp1}|)^2 \times \left\{\frac{I_{On}}{K_{p1}(V_{DD} - V_{CM} - |V_{THp1}|)^2} + \left(1 - \frac{V_C}{(V_{DD} - V_{CM} - |V_{THp1}|)}\right)^2\right\}}$$

Here, $K_{p1}$ and $K_{p2}$ are current constants of the PMOS transistor ($M_{p1}$) and the PMOS transistor ($M_{p2}$), respectively, and $V_{THp1}$ and $V_{THp2}$ are threshold voltages of the PMOS transistor ($M_{p1}$) and the PMOS transistor ($M_{p2}$), respectively.

As shown in Equation 3, the ratio of the first current ($IC_x$) to the second current ($I_{C2}$) of FIG. 4 is in the same form as the approximation equation of Equation 1. The ratio exhibits a characteristic of an exponential function. Therefore, the gain of the amplifier of FIG. 2 exhibits a linear characteristic in dB. Furthermore, a ratio of two currents is represented in the equation in terms of only PMOS constants $K_{p1}$, $K_{p2}$, $V_{THp1}$ and $V_{THp2}$. Thus, the ratio maintains a characteristic of an exponential function even if a mismatch between NMOS and PMOS occurs due to change in temperature, process or supply voltage.

Figure 5:
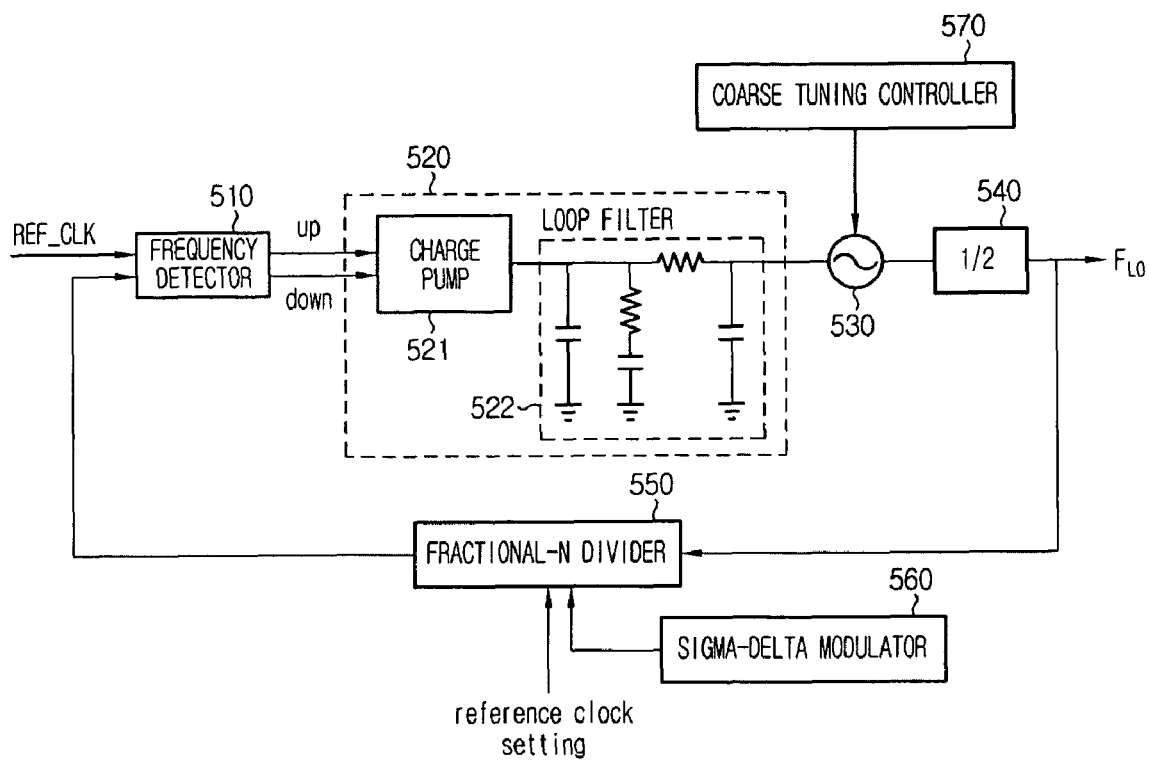
FIG. 5 is a block diagram of an embodiment of the fractional-N phase locked loop of FIG. 1 according to the invention.

FIG. 5 shows an embodiment of the fractional-N phase locked loop 110 of FIG. 1, which includes a frequency detector 510, a pulse-voltage converter 520, a voltage controlled oscillator 530, a ½ divider 540 and a fractional-N divider 550. The frequency detector 510 compares a reference frequency with an output frequency of the fractional-N divider 550, and outputs a pulse signal to the pulse-voltage converter 520. Specifically, the frequency detector 510 compares the reference frequency to the output frequency of the fractional-N divider 550. If the reference frequency is greater than the frequency of the factional-N-divider 550, frequency detector 510 outputs an 'up' pulse signal. If the reference frequency is smaller than the frequency of the factional-N-divider 550, the frequency detector 510 outputs a 'down' pulse signal.

The reference frequency may be not a fixed frequency. As mentioned above, the satellite signal receiver according to the invention can share a temperature compensated crystal oscillator (TCXO) with the other RF (radio frequency) transceiver coexisting on the same system. Therefore, the reference frequency generated from the temperature compensated crystal oscillator may vary depending on the other RF transceiver.

The pulse-voltage converter 520 generates and outputs a predetermined voltage according to the pulse signal output from the frequency detector 510. The pulse-voltage converter 520 includes a charge pump 521 and a loop filter 522. The charge pump 521 may provide or receive current depending on the signal from the frequency detector 510. That is, when the pulse-voltage converter 520 receives an 'up' pulse signal from the frequency detector 510, the pulse-voltage converter 520 provides current to the loop filter 522. When the pulse-voltage converter 520 receives a 'down' pulse signal, the pulse-voltage converter 520 receives current from the loop filter 522. When the loop filter 522 receives current from the charge pump 521, an electric charge is accumulated in a capacitor to increase an output voltage, and when the loop filter 522 provides current to the charge pump 521, an electric charge in the capacitor is dissipated to reduce an output voltage. The output voltage serves as a control voltage of the voltage controlled oscillator 530.

The voltage controlled oscillator 530 outputs a signal with a predetermined frequency according to the output voltage of the pulse-voltage converter 520. An operating frequency of the voltage controlled oscillator 530 is determined by a coarse tuning controller 570. The voltage controlled oscillator 530 adjusts the frequency according to the output voltage of the pulse-voltage converter 520 and outputs a signal.

The ½ divider 540 divides by 2 the output frequency of the voltage controlled oscillator 530, and outputs local oscillator signals. Specifically, the ½ divider 540 divides by ½ the output frequency of the voltage controlled oscillator 530, and outputs two local oscillator signals of I-Phase having different phases (0 degree and 180 degrees) and two local oscillator signals of Q-Phase having different phases (90 degree and 270 degrees).

The fractional-N divider 550 divides by N the frequency of the local oscillator signal output from the ½ divider 540, and outputs the divided oscillator signal to the frequency detector 510. The fraction divisor (a value of N in 1/N) of the fractional-N divider 550 is determined based on a reference frequency. As mentioned above, the reference frequency may vary depending on the other RF transceiver coexisting on the same system, and the fraction divisor is determined according to the determined reference frequency.

The fractional-N divider 550 selects a fraction divisor according to a signal received from a sigma-delta modulator 560 to improve a phase noise performance. In particular, the fractional-N divider 550 selectively selects two fraction divisors (N and N+1) according to the signal received from a sigma-delta modulator 560 and divides the signal. The sigma-delta modulator 560 controls the fractional-N divider 550 so that an average of the fraction divisors selected by the fractional-N divider 550 is uniform, thereby improving the frequency resolution and compensating for fractional spurs.

Figure 6:
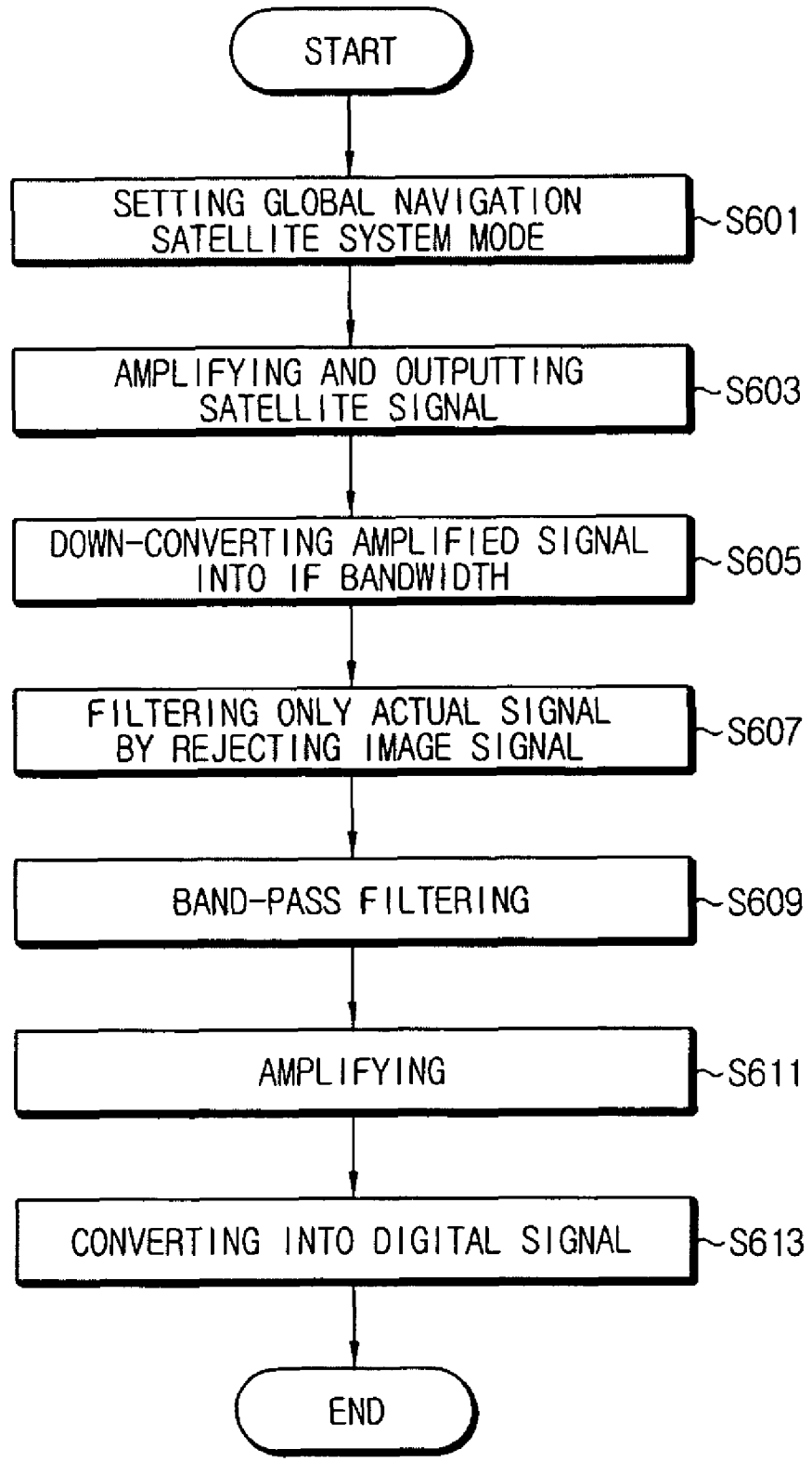
FIG. 6 is a flow chart illustrating an embodiment a satellite signal receiving method of the dual mode satellite signal receiver according to of the invention.

FIG. 6 is a flow chart illustrating an embodiment of a satellite signal receiving method of the dual mode satellite signal receiver according to the invention. The dual mode satellite signal receiver is first set to any one mode, either GPS mode or a Galileo Positioning System mode (S601). After the mode is set, the dual mode satellite signal receiver receives a satellite signal. The low noise amplifier 100 amplifies the received satellite signal and outputs the amplified signal (S603). Specifically, the low noise amplifier 100 has a small noise factor and a gain of approximately 26 dB. The amplifier amplifies the signal and outputs a single phase signal to two differential signal paths ('I' signal and 'Q' signal).

Next, the mixers 101 and 102 mix the satellite signals received from the low noise amplifier 100 with local oscillator signals received from the fractional-N phase locked loop 110, and down-convert the mixed signals to an intermediate frequency band (S605). The mixer 101 and the mixer 102 output signals with phase differences of 90 degrees. Thus, an output signal of the mixer 101 is an 'I' signal of an intermediate frequency band, and an output signal of the mixer 102 is a 'Q' signal of an intermediate frequency band. Preferably, the mixers 101 and 102 down-convert a satellite signal of 1.575 GHz to a frequency of 4 MHz.

Subsequently, the passive poly-phase filter 105 receives the 'I' and the 'Q' signals of a 90-degree phase difference from the mixers 101 and 102, and rejects an image/noise signal and outputs only the actual signal (S607). That is, the passive poly-phase filter 105 receives a 4 MHz signal and a −4 MHz signal, and rejects the image/noise signal, i.e. the signal of a frequency of −4 MHz. Only the 4 MHz signal passes through the passive poly-phase filter 105.

Next, the band-pass filter 107 outputs a predetermined bandwidth of the signal received from the passive poly-phase filter 105 based on a center frequency of 4 MHz, and rejects the other bandwidth (S609). That is, in a GPS mode, the band-pass filter 107 passes a bandwidth of 2 MHz or 4 MHz based on a center frequency of 4 MHz, and in a Galileo mode, the band-pass filter 107 passes a bandwidth of 6 MHz based on a center frequency of 4 MHz.

Subsequently, the variable gain amplifier 108 amplifies the signal received from the band-pass filter 107 to a predetermined level, and outputs the amplified signal to the analog-to-digital converter 109 (S611). To properly operate the analog-to-digital converter 109, the signal level should be constant. The automatic gain control loop senses the output level of the variable gain amplifier 108. If the output level is high, the automatic gain control loop reduces a gain control voltage, so that a gain of the variable gain amplifier 108 is reduced. On the other hand, if the output level is low, the automatic gain control loop increases the gain control voltage, so that the gain of the variable gain amplifier 108 is increased. The variable gain amplifier 108 controls the gain linearly in dB.

The analog-to-digital converter 109 then converts an analog signal received from the variable gain amplifier 108 into a digital signal. Preferably, the analog-to-digital converter 109 converts an analog signal into a 2-bit digital signal, and outputs the digital signal.

The satellite signal receiving method according to the invention may be incorporated as a computer readable code in a computer readable medium. The computer readable medium includes all kinds of storage devices for storing data readable by a computer system. For example, the computer readable medium may be a CD-ROM (Compact Disc Read Only Memory), RAM (Random Access Memory), ROM (Read Only Memory), floppy disc, hard disc or magneto-optical disc.

The above embodiments should not be deemed to limit the scope of this invention. Other embodiments, implementations, enhancements and variations may be within the scope of the invention based on what is described and illustrated herein.

We claim:

1. A dual mode satellite signal receiver capable of supporting at least two global navigation satellite systems, the dual mode satellite signal receiver comprising:
 a frequency synthesizer operative to generate a local oscillator signal based on a reference frequency wherein the frequency synthesizer is capable of supporting multiple reference frequencies;
 a mixer operative to mix the local oscillator signal with a satellite signal and outputting a mixed signal where the mixed signal comprises a signal in an intermediate frequency band;
 a first filter operative to filter the mixed signal to reject an image signal and output an actual signal;
 a second filter operative to filter the actual signal received from the first filter to output a signal in a predetermined bandwidth based on a mode of the receiver; and
 a variable gain amplifier operative to amplify the signal received from the second filter to a predetermined level and output the amplified signal,
 wherein the variable gain amplifier comprises and which comprises an exponential current generator operative to generate a first current and a second current such that a ratio of the first current to the second current varies exponentially to a linear-gain-control voltage received from an automatic gain control loop; an exponential current-to-voltage converter operative to convert the first current and the second current into voltages; and an amplifier operative to amplify an input signal by a gain based on the voltages from the exponential current-to-voltage converter.

2. The dual mode satellite signal receiver according to claim 1, wherein the frequency synthesizer is a fractional-N phase locked loop capable of supporting multiple reference frequencies.

3. The dual mode satellite signal receiver according to claim 2, wherein the frequency synthesizer comprises:
 a voltage controlled oscillator operative to provide the local oscillating signal;

a fractional-N divider operative to divide a frequency of the local oscillator signal by a divisor based on a reference frequency; and a frequency detector operative to compare the reference frequency with the frequency of the signal received from the fractional-N divider and outputting a control signal, wherein the frequency of the voltage controlled oscillator is updated based on the control signal from the frequency detector.

4. The dual mode satellite signal receiver according to claim 1, wherein a center frequency of the second filter is controlled by a clock signal provided by the frequency synthesizer.

5. A dual mode satellite signal receiver capable of supporting at least two global navigation satellite systems, the dual mode satellite signal receiver comprising:

a frequency synthesizer operative to generate a local oscillator signal based on a reference frequency;

a mixer operative to mix the local oscillator signal with a satellite signal and outputting a mixed signal where the mixed signal comprises a signal in an intermediate frequency band;

a first filter operative to filter the mixed signal to reject an image signal and output an actual signal;

a second filter operative to filter the actual signal received from the first filter to output a signal in a predetermined bandwidth based on a mode of the receiver; and a variable gain amplifier operative to amplify the signal received from the second filter to a predetermined level and output the amplified signal, wherein the variable gain amplifier is configured to utilize two internally-generated currents such that the ratio of the currents depend on either only NMOS or only PMOS transistors, wherein the variable gain amplifier comprises an exponential current generator operative to generate a first current and a second current such that a ratio of the first current to the second current varies exponentially to a linear-gain-control voltage received from an automatic gain control loop; an exponential current-to-voltage converter operative to convert the first current and the second current into voltages; and an amplifier operative to amplify an input signal by a gain based on the voltages from the exponential current-to-voltage converter.

6. The dual mode satellite signal receiver according to claim 5, wherein the exponential current generator comprises:

a single-to-differential converter operative to receive a single input voltage and outputting two differential voltages;

a first current generator having an NMOS transistor and configured to generate a first current, where a first differential voltage is input to a gate terminal of the NMOS transistor, and a current source is connected to a drain terminal of the NMOS transistor;

a first current mirror operative to mirror and output the first current;

a second current generator having an NMOS transistor and configured to generate a second current, where a second differential voltage is input to a gate terminal of the NMOS transistor, and a current source is connected to a drain terminal of the NMOS transistor; and a second current mirror operative to mirror and output the second current.

7. The dual mode satellite signal receiver according to claim 5, wherein the exponential current generator comprises:

a single-to-differential converter operative to receive a single input voltage and outputting two differential voltages;

a first current generator having a PMOS transistor and configured to generate a first current, where a first differential voltage is input to a gate terminal of the PMOS transistor, and a current source is connected to a source terminal of the PMOS transistor;

a first current mirror operative to mirror and output the first current;

a second current generator having an PMOS transistor and configured to generate a second current, where a second differential voltage is input to a gate terminal of the PMOS transistor, and a current source is connected to a source terminal of the PMOS transistor; and a second current mirror operative to mirror and output the second current.

8. The dual mode satellite signal receiver according to claim 5, wherein the frequency synthesizer is a fractional-N phase locked loop capable of supporting multiple reference frequencies.

9. The dual mode satellite signal receiver according to claim 8, wherein the frequency synthesizer comprises:

a voltage controlled oscillator operative to provide the local oscillating signal;

a fractional-N divider operative to divide a frequency of the local oscillator signal by a divisor based on a reference frequency; and a frequency detector operative to compare the reference frequency with the frequency of the signal received from the fractional-N divider and outputting a control signal, wherein the frequency of the voltage controlled oscillator is updated based on the control signal from the frequency detector.

10. The dual mode satellite signal receiver according to claim 5, wherein a center frequency of the second filter is controlled by a clock signal provided by the frequency synthesizer.

11. The dual mode satellite signal receiver according to claim 5, wherein the mixer mixes the local oscillator signal with a satellite signal and outputs two signals of an intermediate frequency band having a phase difference of 90 degrees.

12. A satellite signal receiving method for a dual mode satellite signal receiver capable of supporting at least two global navigation satellite systems, the method comprising:

generating a local oscillator signal based on a reference frequency;

mixing the local oscillator signal with a satellite signal and outputting a mixed signal where the mixed signal comprises a signal in an intermediate frequency band;

filtering the output signal in the intermediate frequency band to reject an image signal and output an actual signal;

filtering the actual signal to output a signal in a predetermined bandwidth based on a mode of the receiver; and amplifying the output signal in the predetermined bandwidth to a predetermined level, wherein the amplifying comprises generating a first current and a second current such that a ratio of the first current to the second current varies exponentially to a linear-gain-control voltage received from an automatic gain control loop; converting the first current and the second current into respective voltages; and amplifying the output signal in the predetermined bandwidth by a gain based on the two respective voltages.

13. The satellite signal receiving method according to claim 12, wherein generating a first current and a second current comprises:
- converting a single-ended input signal into two differential signals;
- generating a first current by inputting a first differential signal into a gate terminal of a first NMOS transistor, where a current source is connected to a drain terminal of the first NMOS transistor; and
- generating a second current by inputting a second differential signal into a gate terminal of a second NMOS transistor, where a current source is connected to a drain terminal of the second NMOS transistor.

14. The satellite signal receiving method according to claim 12, wherein generating a first current and a second current includes:
- converting a single-ended input signal into two differential signals;
- generating a first current by inputting a first differential signal into a gate terminal of a first PMOS transistor, where a current source is connected to a source terminal of the first PMOS transistor; and
- generating a second current by inputting a second differential signal into a gate terminal of a second PMOS transistor, where a current source is connected to a source terminal of the second PMOS transistor.

15. The satellite signal receiving method according to claim 12, wherein the generating a local oscillator signal includes:
- generating the local oscillator signal of a predetermined frequency;
- fractionally dividing a frequency of the local oscillator signal by a divisor based on a reference frequency;
- comparing the reference frequency with the divided frequency of the local oscillator signal and generating a corresponding control signal; and
- changing the frequency of the local oscillator signal based on the control signal.

16. The satellite signal receiving method according to claim 12, wherein the mixing mixes the local oscillator signal with a satellite signal and outputs two signals of an intermediate frequency band having a phase difference of 90 degrees.

\* \* \* \* \*